United States Patent
Hou et al.

(10) Patent No.: US 8,092,050 B2
(45) Date of Patent: Jan. 10, 2012

(54) FLUID-CONVECTION HEAT DISSIPATION DEVICE

(76) Inventors: Tsung Chih Hou, Taoyuan County (TW); Liang-Tsai Chen, Taoyuan County (TW); Liang-Wen Chen, Taoyuan County (TW)

( * ) Notice: Subject to any disclaimer, the term of this patent is extended or adjusted under 35 U.S.C. 154(b) by 294 days.

(21) Appl. No.: 12/492,561

(22) Filed: Jun. 26, 2009

(65) Prior Publication Data

US 2010/0061109 A1    Mar. 11, 2010

(30) Foreign Application Priority Data

Sep. 11, 2008  (TW) ................................. 97134810 A

(51) Int. Cl.
*F21V 29/00*    (2006.01)

(52) U.S. Cl. ......... 362/294; 362/218; 362/373; 362/547

(58) Field of Classification Search ................. 165/80.3, 165/104.21; 257/714, 715; 362/218, 294, 362/373, 547

See application file for complete search history.

(56) References Cited

U.S. PATENT DOCUMENTS

| 7,108,400 B2 * | 9/2006 | Yamada et al. | 362/294 |
| 7,178,950 B2 * | 2/2007 | Biber et al. | 362/373 |
| 7,314,291 B2 * | 1/2008 | Tain et al. | 362/294 |
| 2007/0189012 A1 * | 8/2007 | Huang et al. | 362/294 |

* cited by examiner

*Primary Examiner* — Stephen F Husar
(74) *Attorney, Agent, or Firm* — Rosenberg, Klein & Lee

(57) ABSTRACT

A fluid-convection heat dissipation device includes at least one heat dissipation module, at least two baffles, and a heat dissipation fluid. The heat dissipation module forms at least one internal receiving space and has an outside surface to which at least one light emission element is attached. The baffles are arranged in the receiving space to divide the receiving space into a plurality of convection channels that are in fluid communication with each other. The heat dissipation fluid is received in the receiving space as a convection medium displaceable in a circulating path along the plurality of convection channels.

9 Claims, 9 Drawing Sheets

FLUID-CONVECTION HEAT DISSIPATION DEVICE

BACKGROUND OF THE INVENTION

1. Field of the Invention

The present invention relates to a fluid convection heat dissipation device, and in particular to a heat dissipation device that is applicable to an electronic device for generating repeated circulation of enclosed fluid by convection to realize heat dissipation.

2. The Related Arts

Conventional light-emitting diode (LED) based lighting elements have been widely used in applications of environmentally conservative lighting devices or illuminating devices. A major challenge to the LED based lighting devices or illuminating devices is dissipation of heat. In a regular environment, the temperature of an LED in giving off light is that the temperature inside the LED package is around 4-50° C. However, in applications of high power lighting, the internal temperature of the LED package might get as high as 100-120° C. Unless the heat can be properly dissipated, a junction of the LED element may get very high. FIG. 1 of the attached drawings illustrates a temperature distribution curve of the junction of an LED in giving off light. In FIG. 1, the abscissa axis R of the temperature distribution curve F represents the radius of a heat distribution area around the junction of the LED and the ordinate axis T indicates temperature. The following formula is known for describing the curve:

$$T_{junction} = R \times \theta_{junctoin-ambient} \times W + T_{ambient}$$

In other words, as indicated in FIG. 1 and described as the above formula, if the temperature of the junction of an LED continuously maintains at a high temperature, the lifespan of the LED may be shortened.

Conventional heat dissipation modules for light-emitting diodes, such as finned heat dissipation modules, have poor performance and non-uniform heat dissipation. In other words, such conventional heat dissipation modules use the fin to radiate heat into the surroundings and theoretically, the temperature and the thermal energy dissipated are high at a location close to the heat spot. The surrounding air is heated to a high temperature, making the air molecules moving fast and thus leading to poor heat dissipation performance for the fins that are close to the heat source. Even a sufficient number of fins that is calculated on the basis of known theories is provided, the heat dissipation for LED realized by such a mechanism must be assisted by turbulence of air caused by a fan. Since the fan consumes power, which is not considered environmental protection, and failure of the fan may happen, using a fan to assist heat dissipation is not a good solution. In addition, the arrangement of a fan makes the heat dissipation module bulky, which is not advantageous for applications of lighting devices.

Known techniques, such as Taiwan Patent Publication No. I299081, teach improvement of heat dissipation performance by employing internal baffles and interference elements. However, such a known techniques does not help in bringing heat away. In addition, a heat sink and a fan must be arranged at a remote end to carry out second-time heat dissipation. Apparently, such a known technique has a complicated structure and high costs and still suffers the problems of failure of fan and pump, and it is not applicable to a dedicated and small-size LED-based lighting device.

SUMMARY OF THE INVENTION

The state-of-the-art techniques rely only on heat radiation fins and/or complicated and bulky heat dissipation fan to carry out heat dissipation operations and is structurally impossible to efficiently convey heat away from a heat spot and also suffers poor heat dissipation performance and malfunctioning or failure of the heat dissipation fan.

To overcome the problems and drawbacks of the conventional heat dissipation module, the present invention provides a fluid-convection heat dissipation device, which comprises at least one heat dissipation module, at least two baffles, and a heat dissipation fluid. The heat dissipation module forms at least one internal receiving space and has an outside surface to which at least one light emission element is attached. The baffles are arranged in the receiving space to divide the receiving space into a plurality of convection channels that are in fluid communication with each other. The heat dissipation fluid is received in the receiving space of the heat dissipation module to undergo convection as being heated by a heart source spot formed in a junction between the heat dissipation module and the light emission element so as to first flow through the convection channel opposing the junction between the light emission element and the heat dissipation module and further flow along other convection channels to bring thermal energy from the heat source spot to opposite distant ends of the heat dissipation module for dissipation to the surrounding. The temperature reduced heat dissipation fluid then circulates through the convection channels back to the heat source spot on the junction between the light emission element and the heat dissipation module to provide repeated circulation caused by heat convection inside the enclosed space for heat dissipation.

The effectiveness of the fluid-convection heat dissipation device of the present invention is that active circulation of fluid for effecting heat dissipation is induced inside the heat dissipation module through the convection channels formed inside the heat dissipation module so that the intense thermal energy occurring at the junction between the light emission element and the heat dissipation module can be efficiently and effectively brought toward the opposite distant ends of the heat dissipation module thereby remarkably enhancing the heat dissipation efficiency for the light emission element without any additional devices including heat dissipation fans and pumps. This helps extending the lifespan of the light emission element and also facilitates the applications of the light emission elements in the lighting industry.

BRIEF DESCRIPTION OF THE DRAWINGS

The present invention will be apparent to those skilled in the art by reading the following description of a preferred embodiment thereof, with reference to the attached drawings, wherein.

DETAILED DESCRIPTION OF THE PREFERRED EMBODIMENTS

Figure 1:
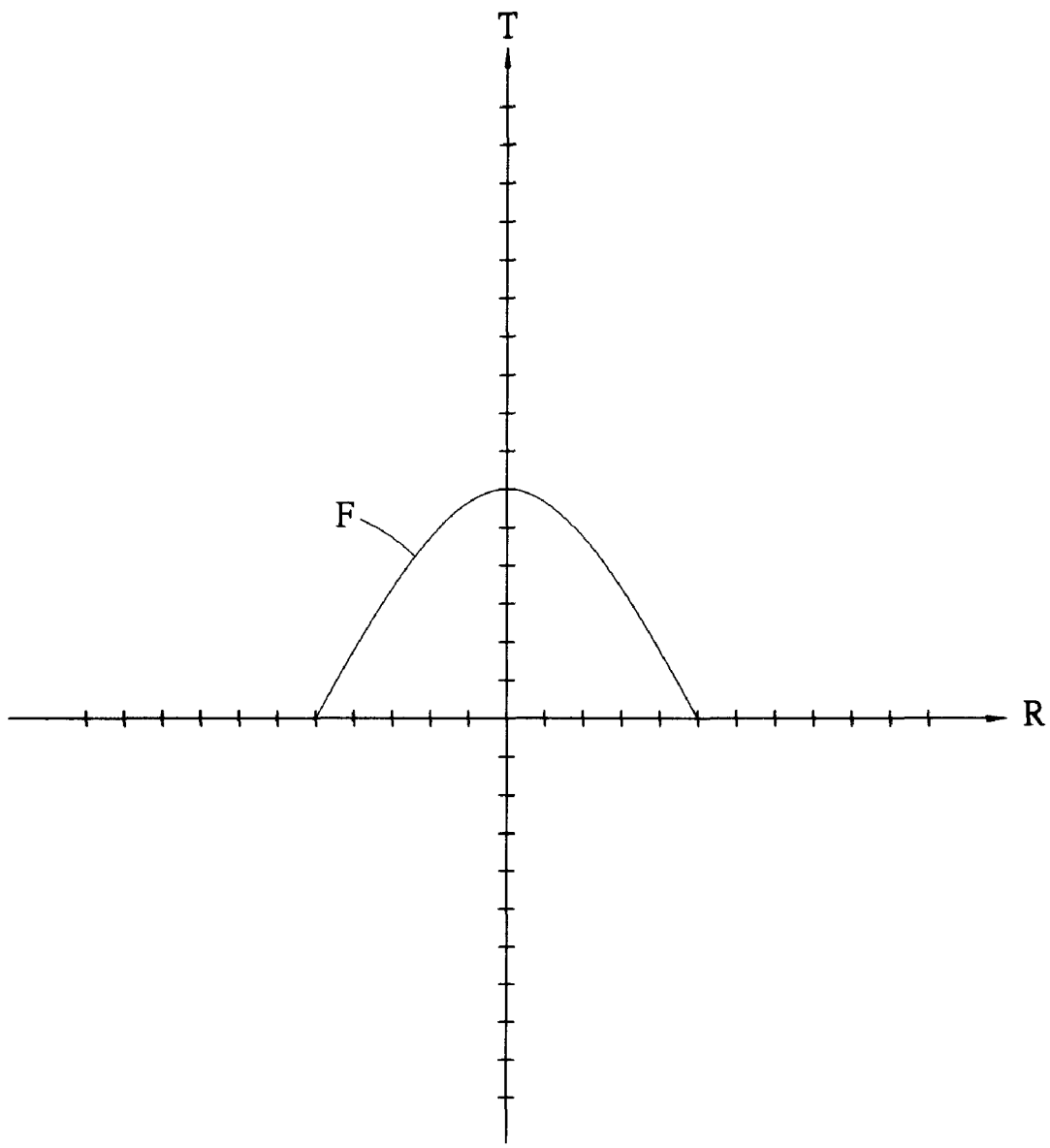
FIG. 1 illustrates a temperature distribution curve of the junction of a conventional light-emitting diode.
Figure 2:
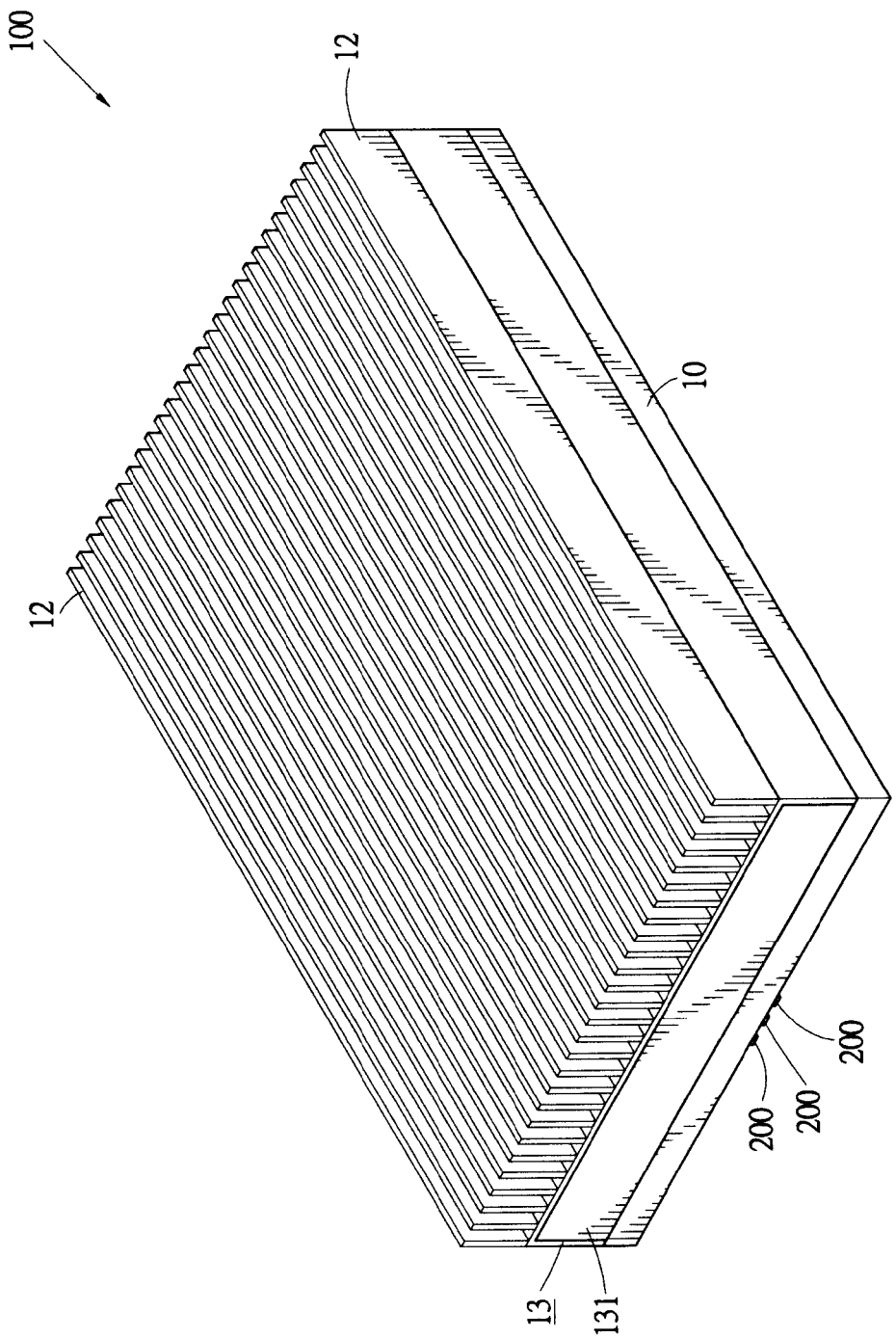
FIG. 2 is a perspective view of a fluid-convection heat dissipation device constructed in accordance with a first embodiment of the present invention.
Figure 3:
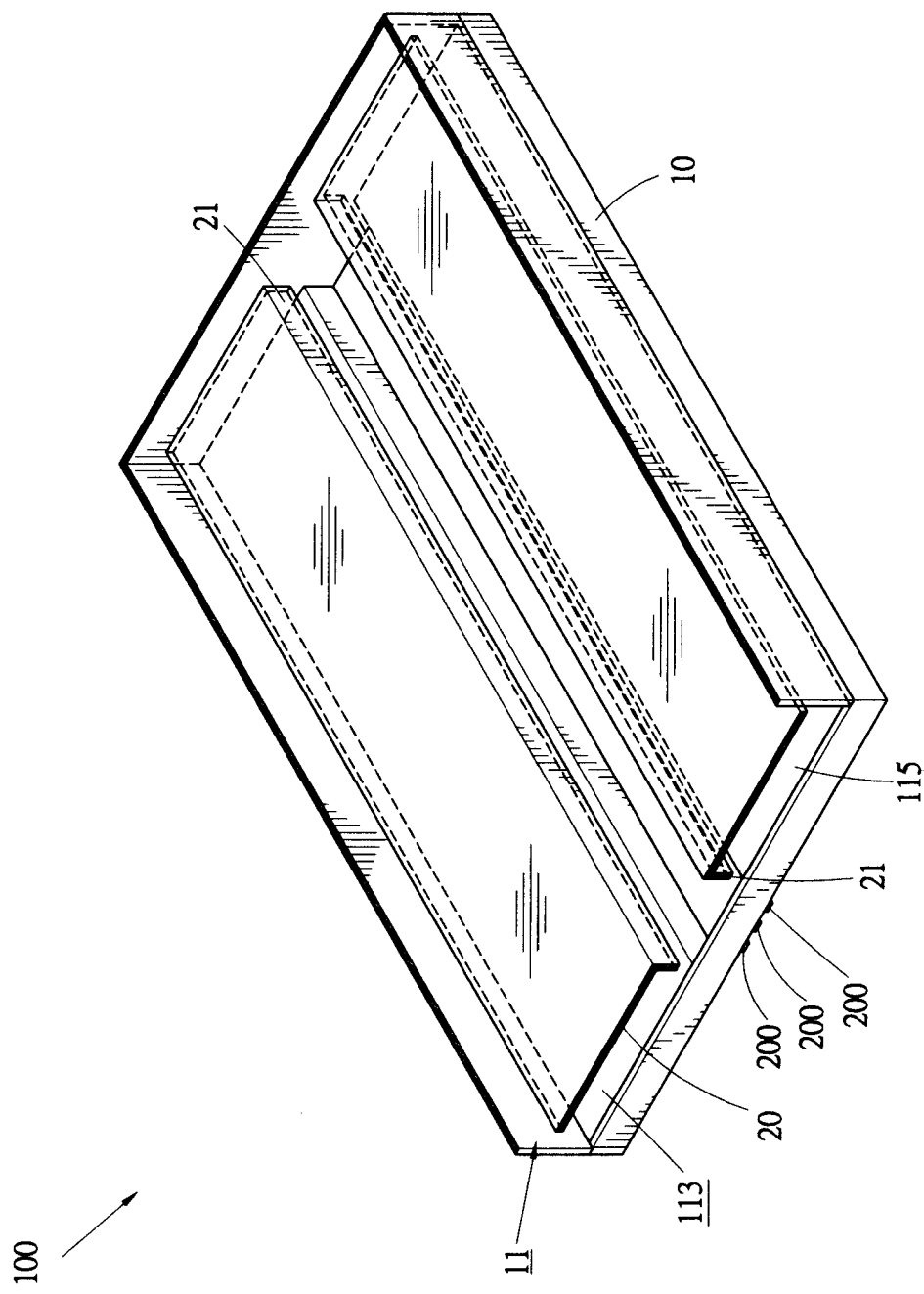
FIG. 3 is perspective view illustrating the arrangement of baffles inside a heat dissipation module of the heat dissipation device of FIG. 2.
Figure 4:
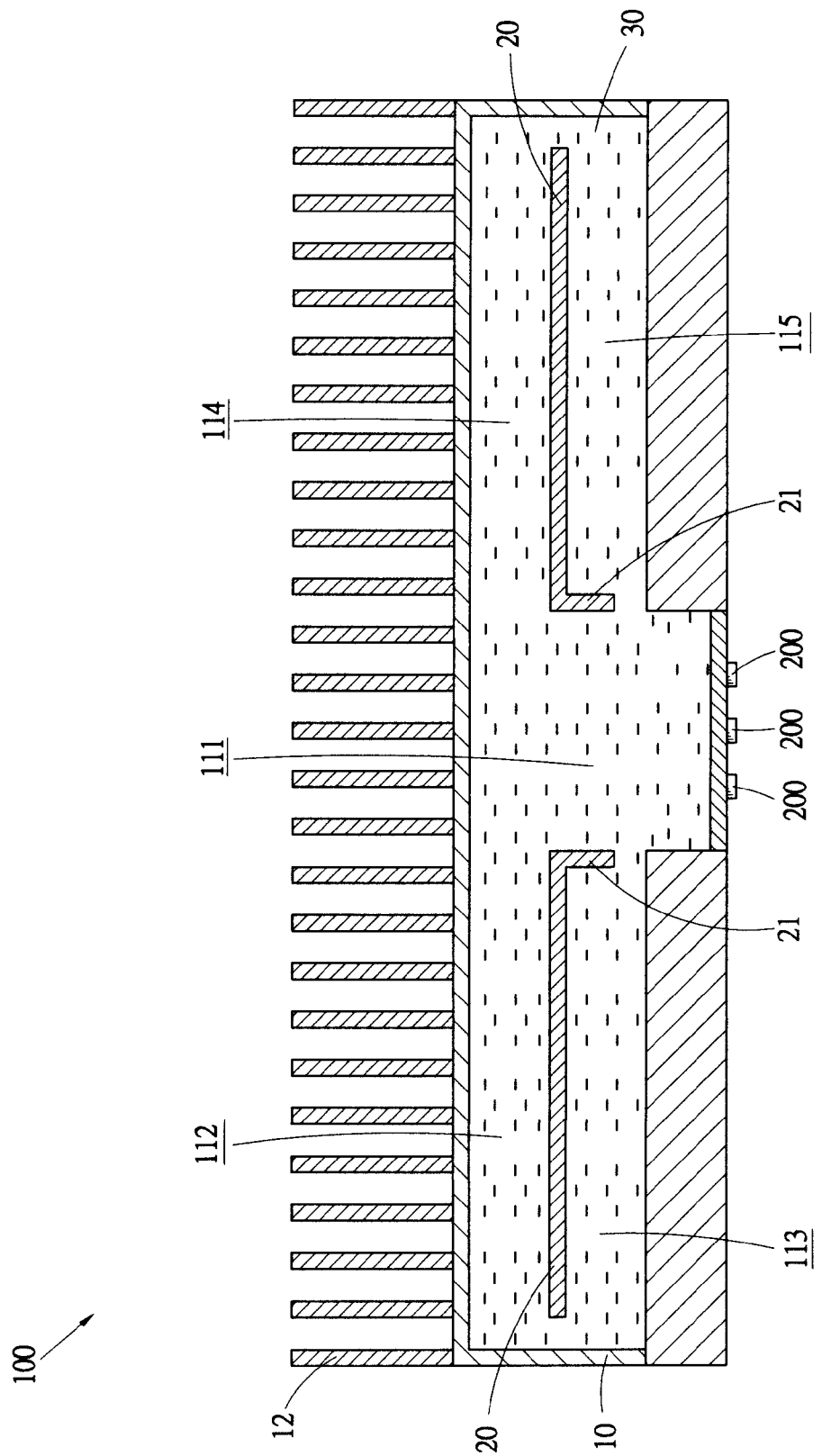
FIG. 4 is a cross-sectional view of the heat dissipation device of FIG. 2.

With reference to the drawings and in particular to FIGS. 2-4, which show a fluid-convection heat dissipation device constructed in accordance with a first embodiment of the present invention, generally designated with reference numeral 100, the heat dissipation device 100 of the present invention comprises a heat dissipation module 10 forming therein at least one receiving space 11 and having a plurality of heat radiating fins 12 on an outside surface thereof. An outside surface of the heat dissipation module functions to receive at least one light emission element 200 mounted thereto. The light emission element 200 is not limited to any specific type, of which an example is a light-emitting diode chip or die, and other light emission elements, such as an infrared light emission element, also belongs to the scope of the present invention.

The light emission element 200 and the heat dissipation module 10 form a junction therebetween, which provides a heat source spot. The fins 12 functions to increase the surface area for dissipation of heat. An outside surface of the heat dissipation module 10 forms at least one opening 13, which is closed by a sealing board 141.

At least two baffles 20 are arranged inside the receiving space 11 to divide the receiving space 11 into a plurality of convection channels 111, 112, 113, 114, 115, wherein the convection channel 111 is set to exactly correspond to the heat source spot at the bottom of the module and each baffle 20 has an end forming at least one guide section 21, whereby the convection channels 111-115 collectively define a central passage and left and right side passages that are in communication with each other.

A heat dissipation fluid 30 is filled in the receiving space 11 through the opening 13 of the heat dissipation module 10 and is sealed by the sealing board 141 thereby confining the heat dissipation fluid 30 inside the receiving space 11. The heat dissipation fluid 30 is not limited to any specific type and composition. A fluorine-based cooling oil is taken as an example in the instant embodiment, but other heat dissipation fluids having similar characteristics are also considered within the scope of the present invention.

The process for filling the heat dissipation fluid 30 into the receiving space 11 of the heat dissipation module 10 is not limited to filling through the opening 13, and other processes, such as drilling a hole in an outside surface of the heat dissipation module 10 to fill the heat dissipation fluid 30 and then sealing the hole, which provide equivalent or similar effect, may also be adopted and are considered within the scope of the present invention.

Figure 5:
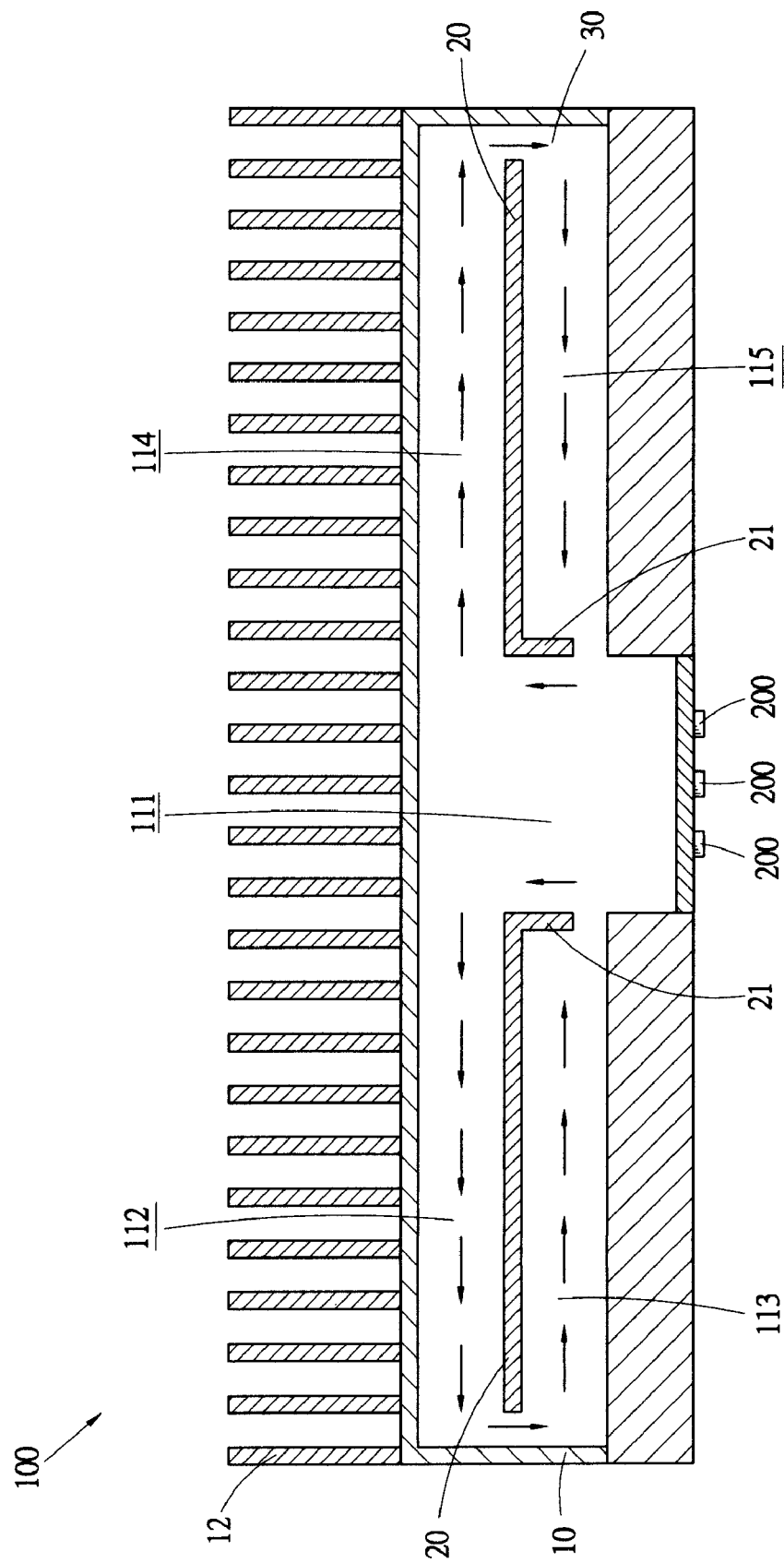
FIG. 5 is a cross-sectional view similar to FIG. 4 but illustrating the flow of heat dissipation fluid inside the heat dissipation module of the heat dissipation device of the present invention.

Also referring to FIG. 5, which illustrates the operation of the fluid-convention heat dissipation device 100 in accordance with the present invention, when the light emission elements 200 are energized to give off light, the junction between the light emission elements 200 and the heat dissipation module 10 is heated up, forming a heat source spot.

The thermal energy that heats the junction is transferred into the heat dissipation fluid 30 contained in the receiving space 11, causing convection of the heat dissipation fluid 30 that makes the heat dissipation fluid 30 to flow upward along the convection channel 111 under the guidance of the guide sections 21 formed at the inner ends of the baffles 20 and then branches in opposite directions through convection channels 112, 114. The branch flow of the heat dissipation fluid 30 in the convection channel 112 then moves downward into the convection channel 113 at an outer end of the baffle 20 to eventually return to the convection channel 111. Similarly, the branch flow of the heat dissipation fluid 30 in the convection channel 114 then travels downward into the convection channel 115 at an outer end of the respective baffle 20 to eventually return to the convection channel 111. The routes of the circulative flow of the heat dissipation fluid 30 inside the receiving space 11 are indicated by arrows shown in FIG. 5, and in this way, the high temperature of the heat source spot at the junction between the heat dissipation module 10 and the light emission elements 200 is efficiently brought away to the opposite outer ends of the heat dissipation module 10 for further dissipation and the temperature of the light emission element 200 is quickly lowered and stably controlled.

Figure 6:
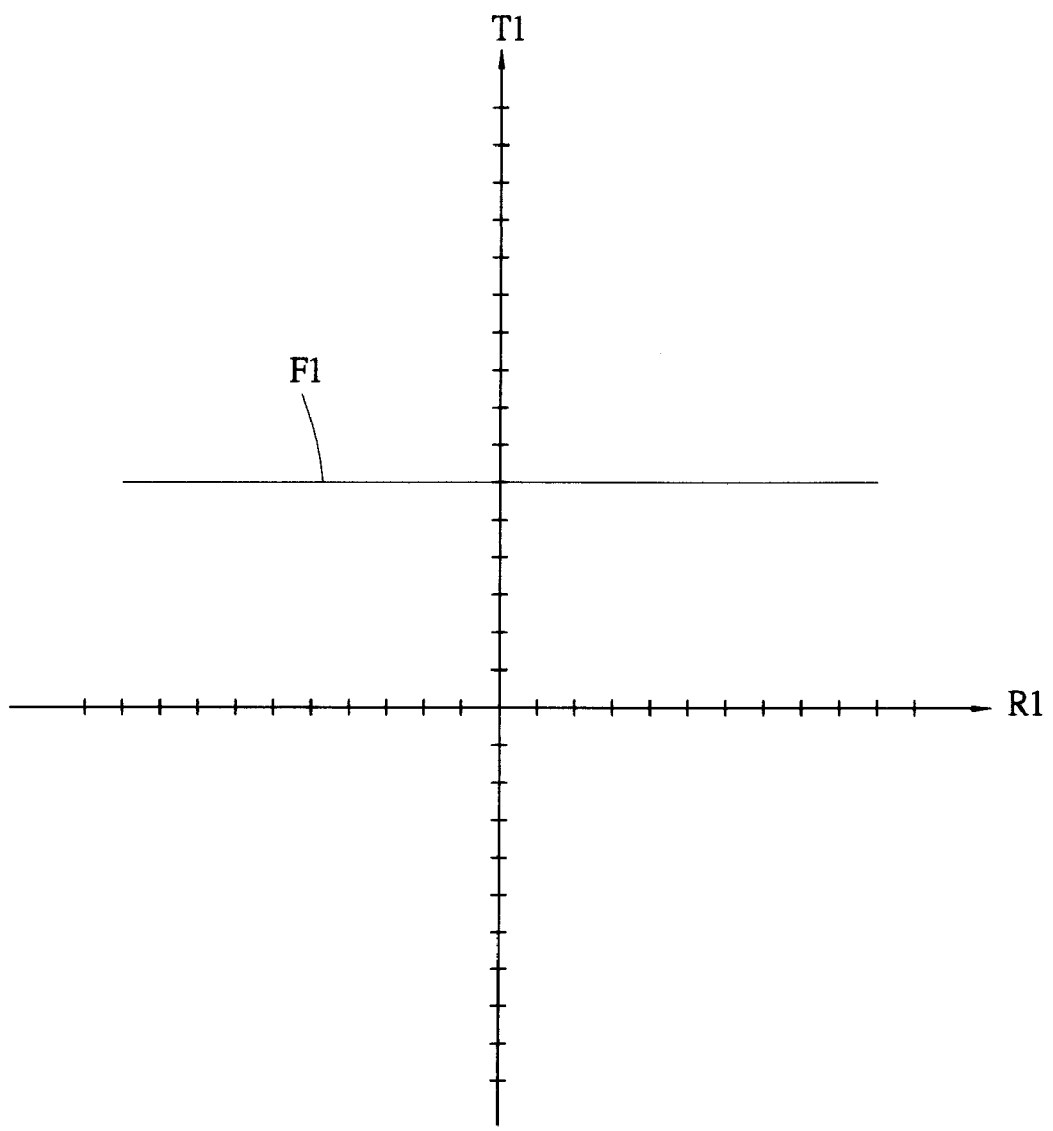
FIG. 6 shows a temperature distribution curve of the fluid-convention heat dissipation device of the present invention with respect to a light emission element.

Also referring to FIG. 6, a curve demonstrating heat-dissipated temperature distribution and temperature rise produced by the fluid-convention heat dissipation device 100 of the present invention applied to a heat source spot of the light emission element 200 is shown. In the heat source spot temperature distribution curve of FIG. 6, the abscissa axis R1 represents the radius of a heat distribution area around the light emission element 200 and the ordinate axis T1 indicates temperature. As can be seen from FIG. 6, the temperature distribution curve F1 shows a substantially constant value, meaning the heat source spot at the junction between the light emission element 200 and the heat dissipation module 10 can be efficiently carried away to the left and right side outer ends to lower the temperature at the center of the light emission element 200.

Figure 7:
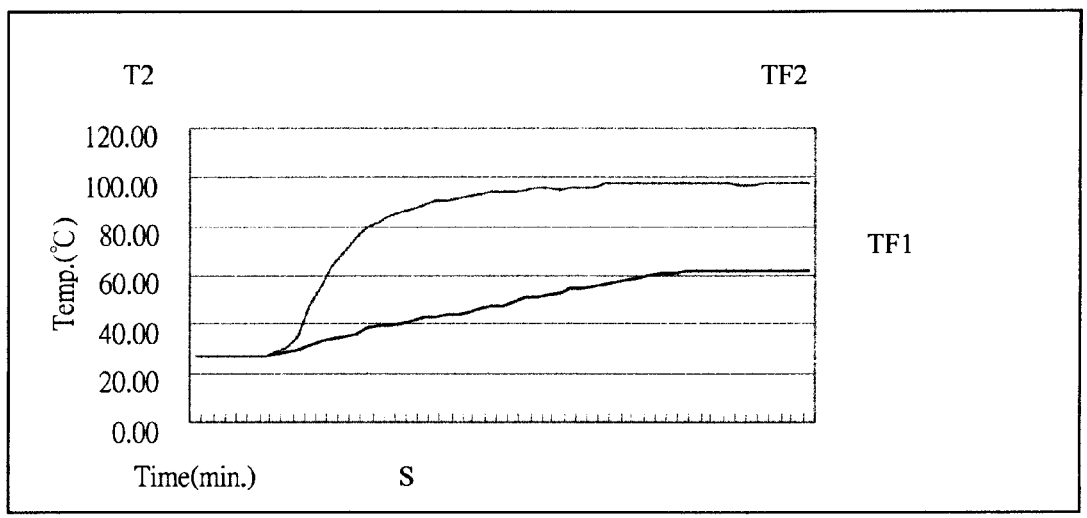
FIG. 7 shows curves of heat dissipation experiment data obtained for the fluid-convention heat dissipation device of the present invention and a conventional heat dissipation module with respect to a light emission element.

Also referring to FIG. 7, curves of heat dissipation experiment data obtained for the fluid-convention heat dissipation device 100 in accordance with the present invention and a conventional heat dissipation module with respect to the light emission element 200 are shown. The abscissa axis S indicates time, while the ordinate axis T2 is temperature. Temperature curve TF1 indicates the heat dissipation temperature in accordance with the fluid-convention heat dissipation device 100 of the present invention and the temperature curve TF2 shows the heat dissipation temperature of the conventional finned heat dissipation module. Heat dissipation experiments are carried under the conditions that the ambient temperature is 27° C., and voltage and current applied to the light emission element 200 are 4.1V and 1500 mA respectively, and the heat dissipation fluid 30 is fluorine-based cooling oil. Apparently, the temperature curve TF1 in accordance with the present invention gets eventually stabilized at around 60° C., which is much lower than the temperature of the curve TF2 of the conventional heat dissipation module, which is as high as 100° C. An apparent conclusion can be drawn that the fluid-convention heat dissipation device 100 of the present invention is effective in improving heat dissipation efficiency with respect to the light emission element 200.

Figure 8:
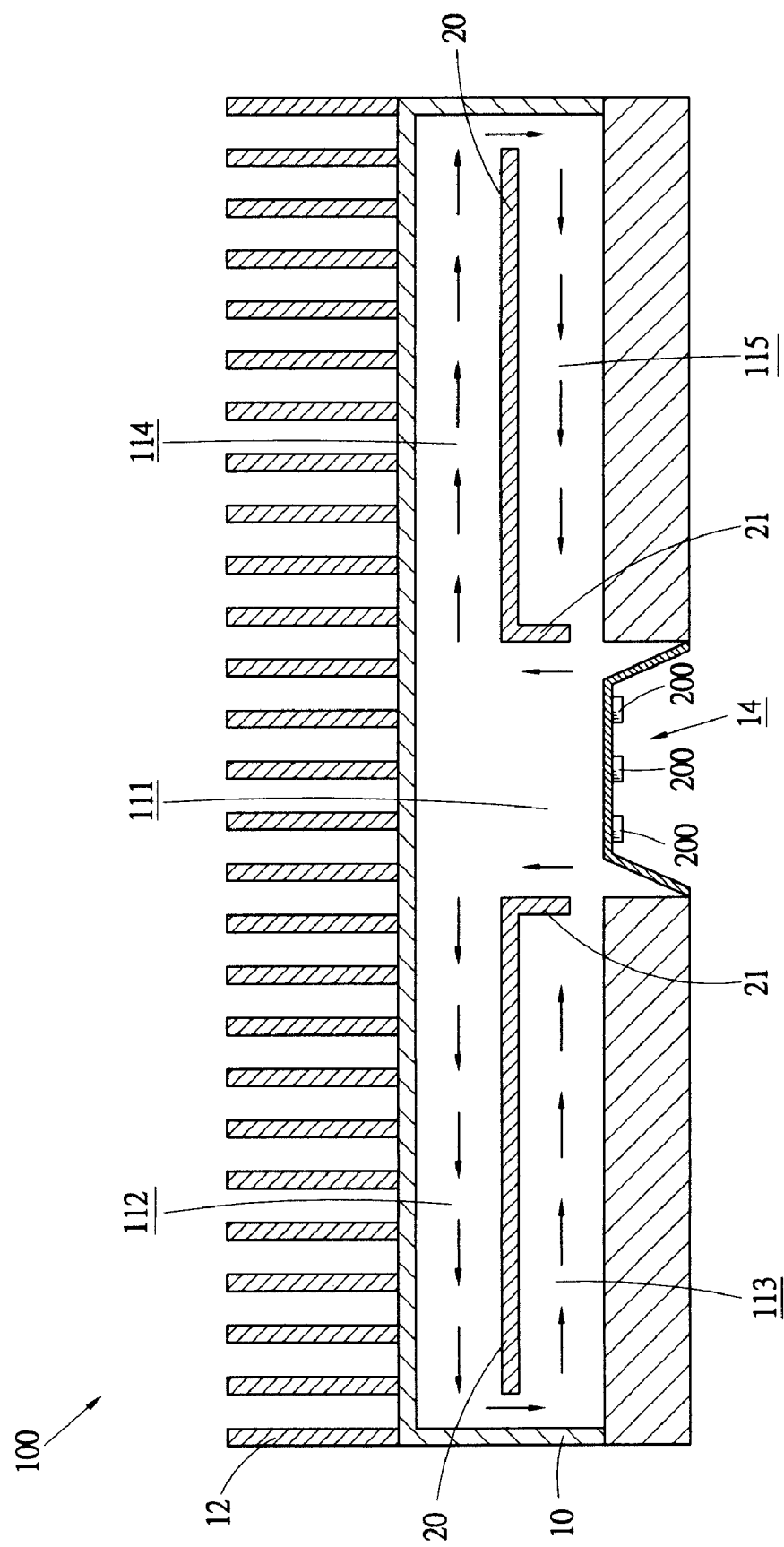
FIG. 8 is a cross-sectional view illustrating a fluid-convection heat dissipation device constructed in accordance with a second embodiment of the present invention.

Also referring to FIG. 8, which illustrates a fluid-convention heat dissipation device in accordance with a second embodiment of the present invention, also designated at 100 for simplicity, the heat dissipation module 10 forms at least one recessed portion 14 on an outside surface thereof. The recessed portion 14 has a bottom to which at least one light emission element 200 is attached. In this way, the recessed portion 14 provides an increased-area heat source spot at the junction thereof with the light emission element 200 to further enhance the performance of heat dissipation realized through the circulation of the heat dissipation fluid 30 through the convection channels 111-115, and also serves as a shade or hood that has a divergent side wall guiding the projection of the light emitted from the light emission element 200.

Figure 9:
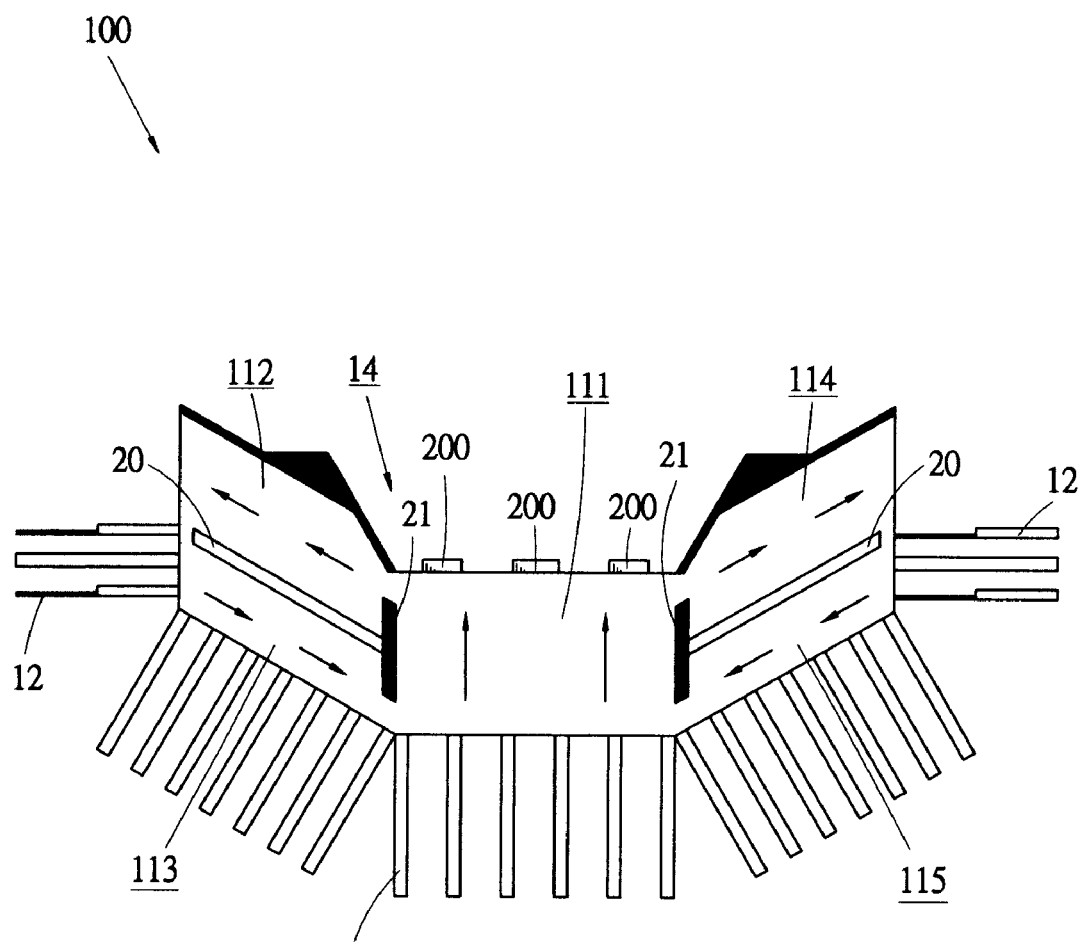
FIG. 9 is a schematic view illustrating a heat dissipation device constructed in accordance with a third embodiment of the present invention.

FIG. 9 illustrates a fluid-convection heat dissipation device in accordance with a third embodiment of the present invention, which is applicable to the occasions similar to those of the second embodiment illustrated in FIG. 8. The heat dissipation module 10 of the third embodiment is of a different cross-sectional configuration, but is still effective to achieve the same internal-fluid-circulation based heat dissipation with respect to the light emission element 200.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A fluid-convection heat dissipation device, comprising:
 a heat dissipation module formed within at least one internal receiving space, the heat dissipation module having an outside surface coupled to at least one light emission element;
 at least two baffles arranged within the receiving space to define a plurality of convection channels that are in fluid communication each with the other; and
 a heat dissipation fluid disposed within the receiving space of the heat dissipation module as a convection medium, wherein the convection medium is displaced in a circulating path along the plurality of convection channels formed around said at least two baffles for channeling heat away from a heat source spot formed in a junction between the heat dissipation module and the light emission element.

2. The fluid-convection heat dissipation device as claimed in claim 1, wherein the heat dissipation module has an outside surface forming a plurality of heat radiating fins.

3. The fluid-convection heat dissipation device as claimed in claim 1, wherein the heat dissipation module has an outside surface forming an opening.

4. The fluid-convection heat dissipation device as claimed in claim 3, wherein the opening is closed by a sealing board.

5. The fluid-convection heat dissipation device as claimed in claim 1, wherein the light emission element attached to the outside surface of the heat dissipation module comprises a light emitting diode chip.

6. The fluid-convection heat dissipation device as claimed in 1, wherein the light emission element attached to the outside surface of the heat dissipation module comprises an infrared light emission element.

7. The fluid-convection heat dissipation device as claimed in 1, wherein the heat dissipation module has an outside surface forming at least one recessed portion for mounting at least one light emission element.

8. The fluid-convection heat dissipation device as claimed in 1, wherein each baffle has an end forming at least one guide section.

9. The fluid-convection heat dissipation device as claimed in 1, wherein the heat dissipation fluid comprises a fluorine-contained cooling oil.

\* \* \* \* \*